United States Patent
Walsh et al.

(10) Patent No.: US 7,927,987 B2
(45) Date of Patent: Apr. 19, 2011

(54) METHOD OF REDUCING CHANNELING OF ION IMPLANTS USING A SACRIFICIAL SCATTERING LAYER

(75) Inventors: Shawn T. Walsh, Richardson, TX (US); Dong Joo Bae, Plano, TX (US); Vikram N. Doshi, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/691,773

(22) Filed: Mar. 27, 2007

(65) Prior Publication Data

US 2008/0242018 A1    Oct. 2, 2008

(51) Int. Cl.
*H01L 21/425* (2006.01)

(52) U.S. Cl. ........ 438/514; 438/194; 438/217; 438/289; 438/291; 438/551; 257/E21.346; 257/E21.618; 257/E21.619; 257/E21.633; 257/E21.634

(58) Field of Classification Search .............. 438/301, 438/514, 228, 194, 217, 289, 291, 551, 723, 438/756; 257/E21.346, E21.618, E21.619, 257/E21.633, E21.634
See application file for complete search history.

(56) References Cited

U.S. PATENT DOCUMENTS

| | | | | |
|---|---|---|---|---|
| 5,422,301 A | * | 6/1995 | Otsuki | 438/217 |
| 5,872,047 A | * | 2/1999 | Lee et al. | 438/530 |
| 5,950,096 A | * | 9/1999 | Huang et al. | 438/443 |
| 6,249,030 B1 | | 6/2001 | Lee | |
| 6,297,132 B1 | * | 10/2001 | Zhang et al. | 438/514 |
| 6,329,225 B1 | * | 12/2001 | Rodder | 438/151 |
| 6,797,188 B1 | * | 9/2004 | Shen et al. | 216/46 |
| 2004/0043586 A1 | * | 3/2004 | Ahmed et al. | 438/514 |

FOREIGN PATENT DOCUMENTS

WO   WO 2006060116   6/2006

OTHER PUBLICATIONS

Wolf et al., Silicon Processing for the VLSI Era, vol. 1: Process Technology, 1986 by Lattice Press, pp. 182-183, 199 and 532-533.*
http://www.devicelink.com/mpb/archive/96/01/003.html.*

* cited by examiner

*Primary Examiner* — Julio J Maldonado
(74) *Attorney, Agent, or Firm* — Warren L. Franz; Wade J. Brady, III; Frederick J. Telecky, Jr.

(57) ABSTRACT

Methods and devices for preventing channeling of dopants during ion implantation are provided. The method includes providing a semiconductor substrate and depositing a sacrificial scattering layer over at least a portion a surface of the substrate, wherein the sacrificial scattering layer includes an amorphous material. The method further includes ion implanting a dopant through the sacrificial scattering layer to within a depth profile in the substrate. Subsequently, the sacrificial scattering layer can be removed such that erosion of the substrate surface is less than one percent of a thickness of the sacrificial scattering layer.

6 Claims, 2 Drawing Sheets

METHOD OF REDUCING CHANNELING OF ION IMPLANTS USING A SACRIFICIAL SCATTERING LAYER

FIELD OF THE INVENTION

The present application relates to integrated circuit devices, and more specifically, to techniques for reducing channeling of ion implanted dopants during fabricating of integrated circuit devices.

BACKGROUND OF THE INVENTION

CMOS fabrication involves multiple ion implants to introduce dopants into a substrate at desired locations to achieve a specified dopant profile. For example, ion implantation is used for threshold voltage control, channel-stop formation, source/drain formation, and well formation. FIG. 1 illustrates a substrate 100 having a single crystal lattice structure represented by a plurality of nuclei 110. In conventional ion implanting, a dopant, also referred to herein as an ion species, is introduced into substrate 100 to a desired dopant profile 120 depicted by the dotted lines. The desired dopant profile 120 is the desired depth distribution of the dopant as controlled by the specified dose and energy. Generally, an ion implant beam 140 is directed at a surface 105 of substrate 100. When dopant ions 150 encounter nuclei 110, dopant ions 150 are deposited to within the desired dopant profile 120.

Problems arise, however, when dopant ions do not encounter nuclei and channel past the desired dopant profile. FIG. 1 illustrates dopant ions 152 that do not encounter nuclei 110 and channel past the desired dopant profile 120 deeper into substrate 100. A conventional method for reducing channeling is to change the angle of ion implant beam relative to the substrate surface. Angling the incident ion beam reduces channeling, but does not prevent it. Changing the angle of ion implant can also adversely affect the performance of the integrated circuit. Moreover, angling the ion implant may not reduce channeling for a polycrystalline substrate. Another conventional method utilizes a randomizing layer formed of silicon dioxide on the substrate surface to prevent channeling. Deposition and removal of conventional randomizing layers, however, is often incompatible with CMOS fabrication processes. Conventional randomizing layers have poor selectivity, for example, on the order of 1:1, and damage the substrate surface during the removal process.

Thus, there is a need for methods that can reduce channeling during ion implantation that are compatible with CMOS fabrication.

SUMMARY

According to various embodiments, a method of forming an integrated circuit is provided. The method includes providing a semiconductor substrate and depositing a sacrificial scattering layer over at least a portion a surface of the substrate, wherein the sacrificial scattering layer includes an amorphous material. The method further includes ion implanting a dopant through the sacrificial scattering layer to within a depth profile in the substrate. Subsequently, the sacrificial scattering layer can be removed such that erosion of the substrate surface is less than one percent of a thickness of the sacrificial scattering layer.

According to various other embodiments, another method for forming an integrated circuit is provided. The method can include forming a first well at a surface of a semiconductor substrate, wherein the first well has a first conductivity type. A gate dielectric layer can be formed on a first portion of the first well and a gate structure can be formed on the gate dielectric layer. A sacrificial scattering layer including an amorphous material can be formed on a second portion of the first well. A dopant of a second conductivity type can be ion implanted into the first well through the sacrificial scattering layer. The sacrificial scattering layer can then be removed such that erosion of the substrate surface is less than one percent of a thickness of the sacrificial scattering layer.

According to various embodiments, a semiconductor device is provided. The a semiconductor device includes a sacrificial scattering layer disposed over at least a portion of the substrate, wherein the sacrificial scattering layer comprises an amorphous material and wherein the at least a portion of the substrate comprises a dopant implanted to form a depth profile.

BRIEF DESCRIPTION OF THE DRAWINGS

The accompanying drawings, which are incorporated in and constitute a part of this specification, illustrate embodiments of the invention and together with the description, serve to explain the principles of the invention. In the figures.

DESCRIPTION OF THE EMBODIMENTS

Reference will now be made in detail to the present embodiments (exemplary embodiments) of the invention, examples of which are illustrated in the accompanying drawings. Wherever possible, the same reference numbers will be used throughout the drawings to refer to the same or like parts.

Reference will now be made in detail to embodiments, examples of which are illustrated in the accompanying drawings. Wherever possible, the same reference numbers will be used throughout the drawings to refer to the same or like parts.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

As used herein, the term "depth profile" means a desired depth distribution of dopants within a substrate.

As used herein, the term "sacrificial" when used to describe a layer means that the layer that can be removed without significant damage to a surface upon which the sacrificial layer is disposed.

As used herein, the term "dopant" refers to any material that can be ion implanted including, but not limited to, ion species, charged atoms, or charged molecules.

Figure 1:
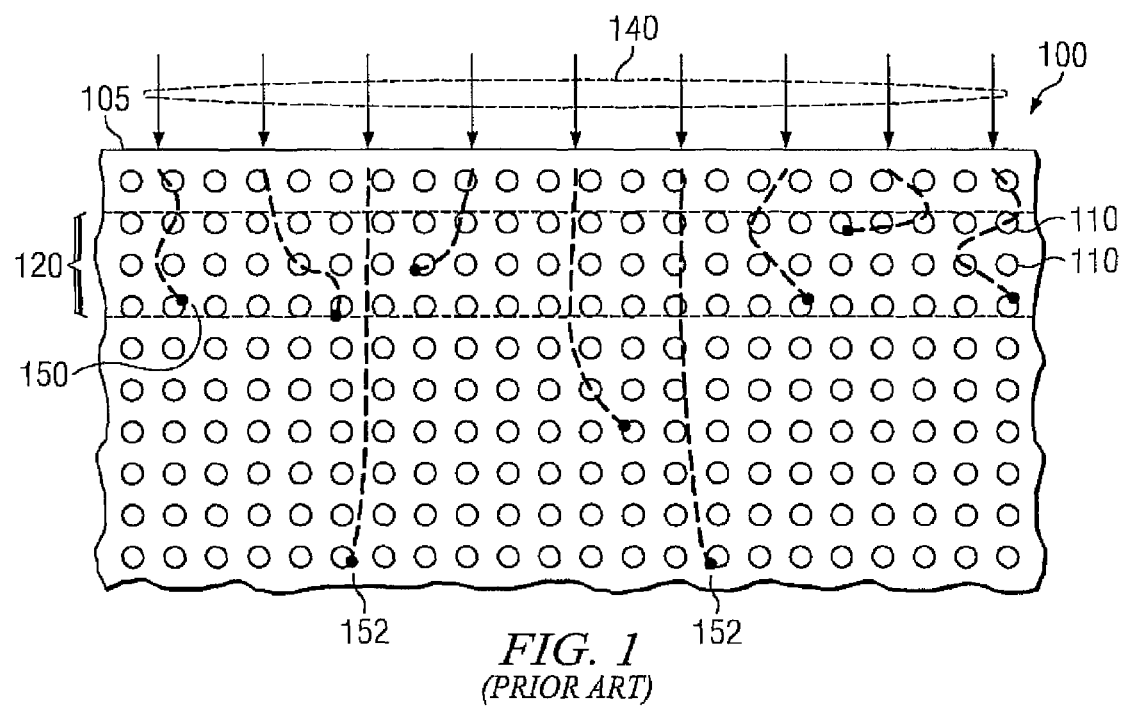
FIG. 1 schematically illustrates a conventional method for reducing channeling.
Figure 2:
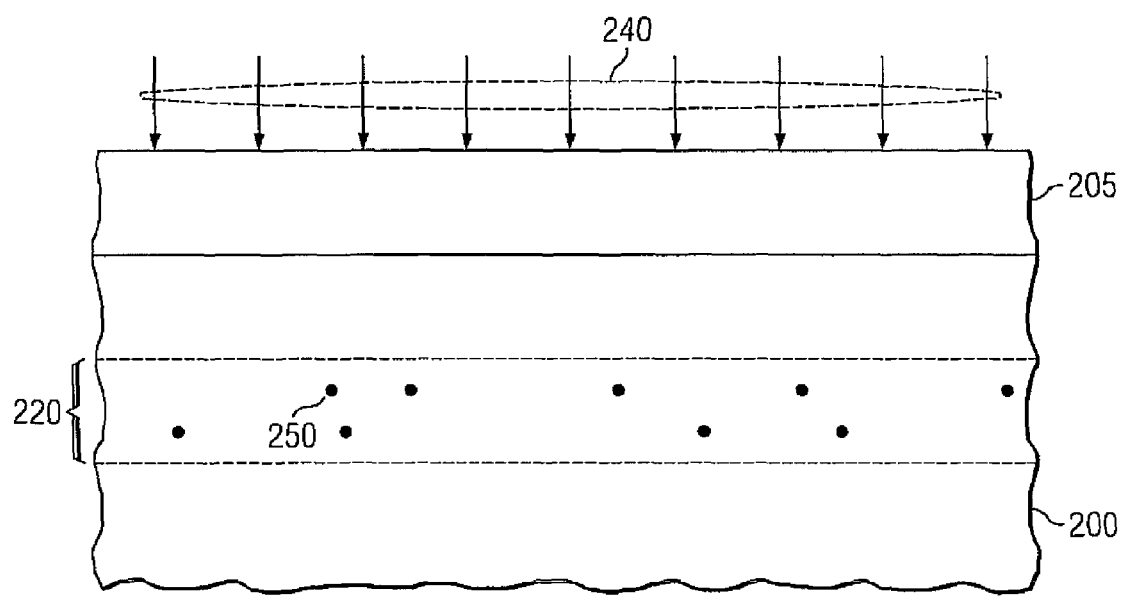
FIG. 2 is a cross sectional schematic illustration of a semiconductor device including a sacrificial scattering layer according to various embodiments of the present teachings.
Figure 3A:
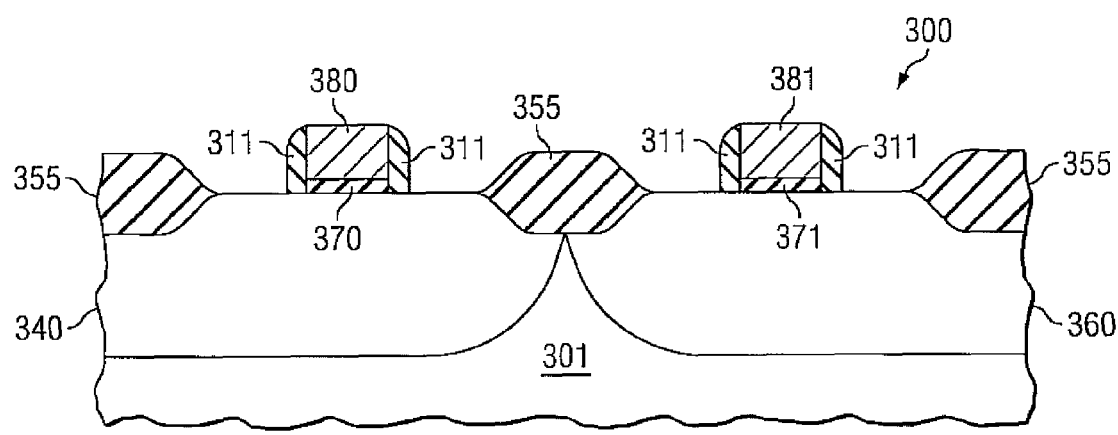
FIGS. 3A-C are cross sectional schematic illustrations of a method for making a semiconductor device using a sacrificial scattering layer according to various embodiments of the present teachings.
Figure 3B:
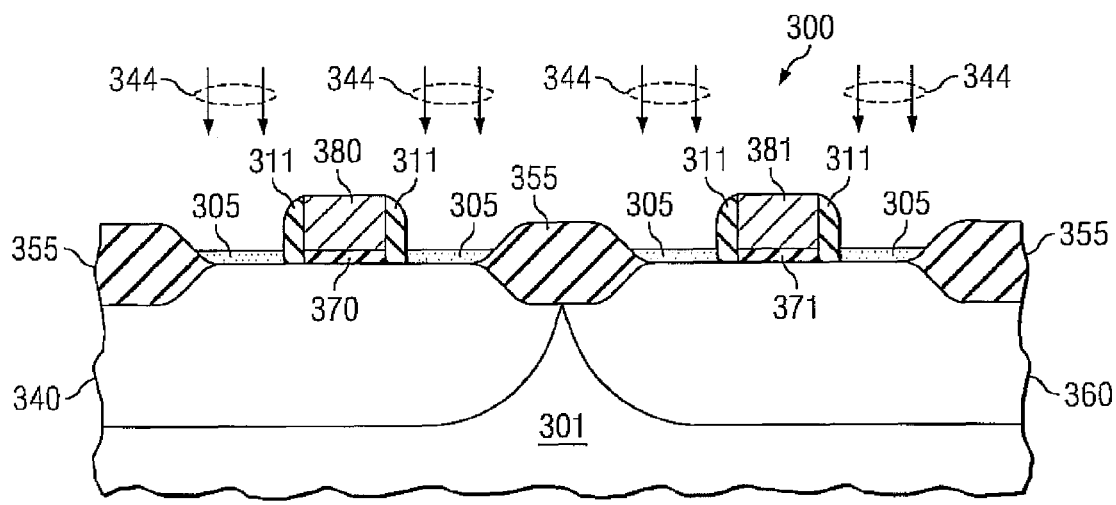
Figure 3C:
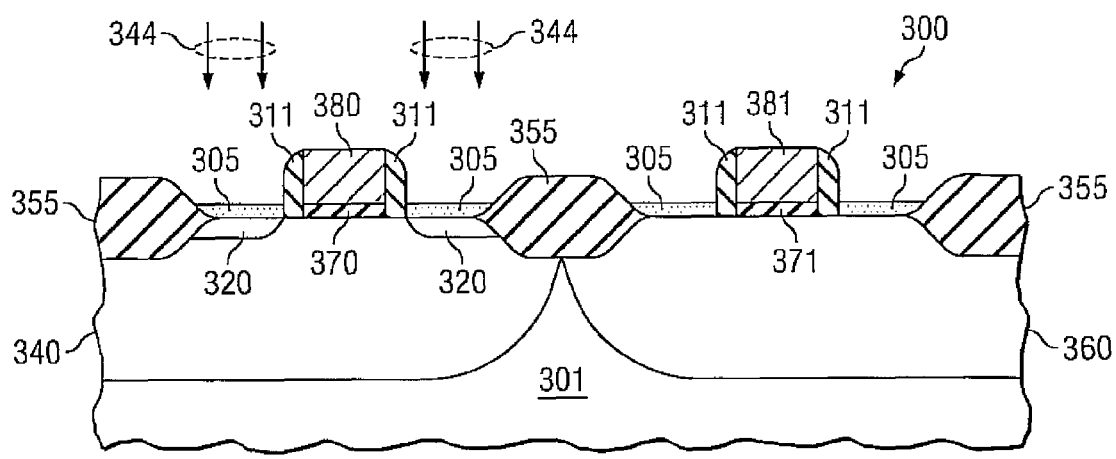

FIGS. 2-3C illustrate exemplary semiconductor devices and methods for making semiconductor devices that can prevent channeling of dopants that are ion implanted into a semiconductor substrate. In particular, exemplary methods can include a sacrificial scattering layer, formed of an amorphous material, disposed over at least a portion of the substrate. A dopant can be ion implanted through the sacrificial scattering layer to within a depth profile in the substrate. While not intending to be bound by any particular theory, it is believed that the sacrificial scattering layer randomly scatters the dopants of the ion beam to prevent channeling. The sacrificial scattering layer can then be removed with minimal damage to the substrate surface. In various embodiments, the sacrificial scattering layer can be used for one or more ion implantations prior to removal.

FIG. 2 schematically depicts an exemplary method for ion implanting using a sacrificial scattering layer into a semiconductor substrate 201 according to the present teachings. Semiconductor substrate 201 can be, for example, a single crystal substrate or a polycrystalline substrate. Semiconductor substrate 201 can further include a desired dopant profile 220. Absent channeling effects, dopants can be implanted to within the desired dopant profile 220 by controlling the ion energy and dose of the dopants.

A sacrificial scattering layer 205 can be formed over semiconductor substrate 201. Sacrificial scattering layer 205 can be formed of an amorphous material, such as, for example, a poly(p-xylylene) polymer material, parylene.

In various embodiments, sacrificial scattering layer 205 can be used for two or more ion implantations. In various other embodiments, sacrificial scattering layer 205 can be formed of a plurality of layers. In still other embodiments, additional sacrificial scattering layers can be formed over sacrificial scattering layer 205, for example, for use during multiple ion implantation steps.

According to various embodiments, sacrificial scattering layer 205 can be formed on at least a portion of semiconductor substrate 201 by one or more of physical vapor deposition, chemical vapor deposition, plasma enhanced deposition, spinning, sputtering, or evaporation. According to various embodiments, sacrificial scattering layer 205 can have a thickness of about 10 nm to about 100 nm.

A dopant 250 can then be ion implanted through the sacrificial scattering layer 205 to within the depth profile 220 in the substrate 201. The ion implant is shown by arrows 240, and doses and energies appropriate for the desired application can be determined by one of ordinary skill in the art. Dopants 250 implanted through sacrificial scattering layer 205 can be located within depth profile 220 because sacrificial scattering layer 205 scatters the dopant to prevent channeling of the dopant outside of the depth profile.

In various embodiments, sacrificial scattering layer 205 can then be removed. Removal can be accomplished without significant damage to the surface of semiconductor substrate 201. For example, sacrificial scattering layer 205 can be removed in a manner such that removal of material from the surface of substrate 201 is less than one percent of the thickness of sacrificial scattering layer 205. Examples of removing sacrificial scattering layer 205 include, but are not limited to, using one or more of dissolution using $H_2O$, ashing, reactive plasma, a dilute HF solution, a solution comprising sulfuric acid, a solution comprising mineral acid, and a solution comprising organic acid, removal using a mineral alkaline solution, removal using an organic alkaline solution, and removal by exposure to light followed by an alkaline solution. In various embodiments, the method for removal of the sacrificial scattering layer 205 can have a selectivity of about 1000:1 or more.

An exemplary method, for ion implanting dopants to within a dopant profile during source/drain formation to prevent channeling will now be provided. Although the following description is directed to formation of the source/drain, one of ordinary skill in the art will understand that the disclosed method can be used during any process in semiconductor device formation that includes ion implanting including, but not limited for, threshold voltage control, source/drain formation, well formation, polysilicon resistor formation, bipolar transistor emitter formation, bipolar transistor base formation, bipolar transistor collector formation, amorphizing layer formation, and buried transistor channel formation.

FIG. 3A shows a semiconductor device 300 including a single crystal silicon substrate 301. At this point of fabrication of device 300, substrate 301 can also include, for example, an n-channel transistor and a p-channel transistor. One of ordinary skill in the art will recognize that device 300 can include additional transistors, interconnects, and can be incorporated with other structures, such as, for example, capacitors, resistors, and bipolar transistors, all of which are not shown. Substrate 301 can be a very lightly-doped single crystal silicon wafer including wells 340 and 360. According to various embodiments, well 340 can be a lightly-doped p-type region and well 360 can be a lightly-doped n-type region. Field oxide structures 355 can be disposed on a surface of substrate 301 to serve as isolation structures for the subsequently formed source/drain regions. Device 300 can further include gate dielectric structures 370 and 371 disposed on wells 340 and 360, with gate structures 380 and 381 disposed on gate dielectric structures 370 and 371, respectively. In some embodiments, sidewalls 311 can be disposed on gates 380 and 381.

Referring now to FIG. 3B, a sacrificial scattering layer 305 can be formed on at least a portion of the surface of substrate 301. In particular, sacrificial scattering layer 305 can be formed on exposed portions of the surface of substrate 301 over wells 340 and/or 360, and between the field oxide 355 and the gate structures 380, 381. In various embodiments, sacrificial scattering layer 305 can be formed by physical vapor deposition of parylene to a thickness of about 20 nm.

After formation of sacrificial scattering layer 305, an n-type dopant for the formation of the source/drain regions can be ion implanted in well 340. An ion beam is depicted as arrows 344 in FIG. 3B. Dose and energy of ion beam 344 can be determined by one of ordinary skill in the art based on, among other things, the composition and thickness of the sacrificial scattering layer, the type of dopant, and the desired dopant profile for a source/drain region. According to various embodiments, the n-type dopant can be deposited to a desired dopant profile for a source/drain region. As discussed herein, use of sacrificial scattering layer 305 can permit ion implanting dopants to within the desired dopant profile for a source/drain region and avoid channeling of dopants outside of the desired dopant profile for a source/drain region.

A desired dopant profile for a source/drain region 320 is shown in FIG. 3C. After formation of source/drain region 320, sacrificial scattering layer 305 can be removed by methods disclosed herein such that erosion of the surface of substrate 301 under sacrificial scattering layer 305 is less than one percent of the thickness of sacrificial scattering layer 305. In various embodiments, the method of removing sacrificial scattering layer 305 can have a selectivity of 1000:1 or more. For example, removal of the 20 nm parylene sacrificial scattering layer can be accomplished by ashing such that erosion of the surface of the underlying substrate is less than 0.1 nm. One of ordinary skill in the art will understand that formation of a source/drain region can be subsequently formed in well 360. According to various embodiments, a second sacrificial scattering layer (not shown) can be formed on sacrificial scattering layer 305 to facilitate ion implanting dopants into well 360. Both sacrificial scattering layer 305 and second sacrificial scattering layer can subsequently be removed after formation of the source/drain regions in well 360.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising."

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of forming an integrated circuit comprising:
   providing a substrate comprising silicon, the substrate having oxide structures disposed on a surface;
   depositing a sacrificial scattering layer over at least a portion of a surface of the substrate, wherein the sacrificial scattering layer comprises parylene;
   ion implanting a dopant through the sacrificial scattering layer to within a depth profile into the substrate, wherein the sacrificial scattering layer scatters the dopant to prevent channeling of the dopant outside of the depth profile; and
   following ion implanting the dopant, removing the sacrificial scattering layer such that erosion of the substrate surface is less than one percent of a thickness of the sacrificial scattering layer.

2. The method of claim 1, wherein the parylene is deposited to a thickness of about 20 nm.

3. A method of forming an integrated circuit comprising:
   providing a substrate comprising silicon, the substrate having oxide structures disposed on a surface;
   depositing a sacrificial scattering layer over at least a portion of a surface of the substrate, wherein the sacrificial scattering layer comprises an amorphous poly(p-xylylene) polymer material;
   ion implanting a dopant through the sacrificial scattering layer to within a depth profile into the substrate, wherein the sacrificial scattering layer scatters the dopant to prevent channeling of the dopant outside of the depth profile; and
   following ion implanting the dopant, removing the sacrificial scattering layer with a selectivity of 1000:1 or more relative to silicon and oxide.

4. The method of claim 3, wherein the sacrificial scattering layer is parylene deposited to a thickness of about 20 nm.

5. A method of forming an integrated circuit comprising:
   providing a substrate comprising silicon, wells formed between oxide structures on the substrate, gate dielectric structures disposed on the wells, gate structures disposed on the gate dielectric structures, and sidewalls disposed on the gates;
   depositing a sacrificial scattering layer over at least a portion of a surface of the substrate, including over at least portions of the oxide structures and the sidewalls, wherein the sacrificial scattering layer comprises an amorphous poly(p-xylylene) polymer material and at least other portions of the oxide structures, sidewalls and gate structures left exposed;
   forming source/drain regions by ion implanting a dopant through the sacrificial scattering layer to within a depth profile into the wells, wherein the sacrificial scattering layer scatters the dopant to prevent channeling of the dopant outside of the depth profile; and
   following ion implanting the dopant and with the at least other portions of the oxide structures, sidewalls and gate structures left exposed, removing the sacrificial scattering layer with a selectivity of 1000:1 or more relative to the substrate silicon, the oxide structure oxide and the sidewalls.

6. The method of claim 5, wherein the sacrificial scattering layer is parylene deposited to a thickness of about 20 nm.

* * * * *